(12) United States Patent
Geske

(10) Patent No.: US 10,461,454 B2
(45) Date of Patent: Oct. 29, 2019

(54) PLUG-IN CONTACT AND METHOD FOR PRODUCING A PLUG-IN CONTACT

(71) Applicant: Phoenix Contact GmbH & Co. KG, Blomberg (DE)

(72) Inventor: Ralf Geske, Schieder-Schwalenberg (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 15/774,412

(22) PCT Filed: Nov. 10, 2016

(86) PCT No.: PCT/EP2016/077335
§ 371 (c)(1),
(2) Date: May 8, 2018

(87) PCT Pub. No.: WO2017/081194
PCT Pub. Date: May 18, 2017

(65) Prior Publication Data
US 2018/0331447 A1 Nov. 15, 2018

(30) Foreign Application Priority Data
Nov. 11, 2015 (DE) .......................... 10 2015 119 473

(51) Int. Cl.
*H01R 13/05* (2006.01)
*H01R 12/58* (2011.01)
(Continued)

(52) U.S. Cl.
CPC ......... *H01R 13/052* (2013.01); *H01R 12/585* (2013.01); *H01R 12/71* (2013.01);
(Continued)

(58) Field of Classification Search
CPC ...... H01R 12/585; H01R 9/092; H01R 12/71; H01R 13/052; H01R 43/16; H05K 1/184;
(Continued)

(56) References Cited

U.S. PATENT DOCUMENTS 3,820,061 A * 6/1974 Holden .................. H05K 3/308
439/65
5,709,556 A * 1/1998 Tan .................... H01R 12/7029
439/567
(Continued)

FOREIGN PATENT DOCUMENTS

DE 1 915 571 U 5/1965
DE 2 228 953 A1 1/1974
JP 58-2976 U 1/1983

*Primary Examiner* — Gary F Paumen
(74) *Attorney, Agent, or Firm* — David S. Safran; Roberts Mlotkowski Safran Cole & Calderon, P.C.

(57) ABSTRACT

A plug contact for electrically contacting a circuit board by inserting the plug contact into a via hole in the circuit board, the plug contact having two flat contact arms that are resilient relative to each other, and a connecting region, from which the two contact arms extend in the plug-in direction of the plug contact, the plug contact being punched as a single piece from a flat metallic material. In the connection region, adjacent to the two contact arms, a recess is formed in the plug contact, the distance between the two contact arms increases from the recess towards the free ends of the contact arms, the two contact arms being spread apart relative to each other and the two contact arms together having a width which is the same as or only slightly smaller than the diameter of the corresponding via hole in the circuit board.

11 Claims, 4 Drawing Sheets

(51) Int. Cl.
 *H01R 43/16* (2006.01)
 *H01R 12/71* (2011.01)
 *H05K 1/18* (2006.01)

(52) U.S. Cl.
 CPC ............ *H01R 43/16* (2013.01); *H05K 1/184* (2013.01); *H05K 2201/10863* (2013.01); *H05K 2201/10878* (2013.01); *H05K 2201/10901* (2013.01); *H05K 2201/10939* (2013.01)

(58) Field of Classification Search
 CPC .......... H05K 2201/10863; H05K 2201/10878; H05K 2201/10901; H05K 2201/10939
 USPC .................................................. 439/82, 751
 See application file for complete search history.

(56) References Cited

U.S. PATENT DOCUMENTS

| | | | |
|---|---|---|---|
| 8,992,236 B2 * | 3/2015 | Wittig | H01R 12/585 439/82 |
| 9,356,367 B2 | 5/2016 | Vino, IV et al. | |
| 2003/0114027 A1 * | 6/2003 | Wurster | H05K 3/366 439/82 |
| 2012/0228016 A1 * | 9/2012 | Sass | H05K 3/308 174/261 |
| 2013/0316551 A1 * | 11/2013 | Day, Jr. | H05K 13/04 439/84 |
| 2015/0194752 A1 * | 7/2015 | Vino, IV | H05K 1/184 174/260 |

\* cited by examiner

PLUG-IN CONTACT AND METHOD FOR PRODUCING A PLUG-IN CONTACT

BACKGROUND OF THE INVENTION

Field of the Invention

The invention relates to a plug-in contact for making electrical contact with a circuit board by means of plugging the plug-in contact into a contact hole of the circuit board, with two flat contact legs which are resilient relative to one another, and one connecting region from which the two contact legs extend in the plug-in direction of the plug-in contact, the plug-in contact being punched in one piece out of a metallic flat material. Moreover, the invention also relates to a method for producing a plug-in contact with two flat contact legs which are resilient relative to one another, and one connecting region.

Description of Related Art

Plug-in contacts for producing electrical and/or electronic connections between leads, different components or the like and busbars are known in different embodiments and for different applications. The plug-in contacts are plugged into corresponding receiving contacts or jack elements for this purpose; the receiving contacts can be for example corresponding openings in busbars or the like. The plug-in contacts themselves can be connected to electrical components or can be made for connection to electrical leads.

There are different techniques for the connection between a circuit board and an electrical component, in practice mainly soldering and forcing-in having established themselves. Both techniques have proven effective over the years since they ensure good and permanent electrical contact between the contact partners. But one disadvantage both of soldering and also forcing-in is that the two connecting techniques are not reversible, so that a connection, once established, cannot be broken again, or can only with increased effort. Moreover, additional working steps and/or special tools are necessary to establish the connection. Here plug-in connections which have been used for decades in other applications offer one alternative since the connection can be easily established and moreover can also be broken again by hand, is therefore reversible.

For some time, a plug-in contact which was made for use in circuit boards and which is made in the manner of a spring yoke and has two flat contact legs which are resilient relative to one another and which are connected to one another via a common connecting region has been known from practice. In the known plug-in contact a region as narrow as possible between the contact legs is punched out to produce the two contact legs. FIG. 1 shows a drawing of one such known plug-in contact.

So that the two contact legs can be reliably produced using punching technology, their width must correspond approximately to their thickness, i.e. the thickness of the flat material from which the plug-in contact is being altogether punched out. Since the width of the region punched out between the two contact legs corresponds approximately to the material thickness of the flat material, it happens that the width of the individual contact legs is only barely ⅓ of the total width of the plug-in contact. The total width of the plug-in contact, i.e., the width of the two contact legs and the width of the region which has been punched out between the two contact legs, is determined by the diameter of the contact hole in the circuit board into which the plug-in contact is to be plugged. For small hole diameters this leads to the contact legs of the plug-in contact having to be made very narrow and thin. First of all, this can be difficult to accomplish using punching technology and moreover leads to the normal contact force which can be applied by the contact legs being relatively small.

While a gastight connection between the contact partners arises due to the high forces during the connection process in a press-in connection, in a plug-in connection this intermetallic connection does not occur. In a plug-in connection the contact partners, i.e., the plug-in contact and the contact hole in the circuit board, press against one another with the normal contact force. The latter must be large enough to be able to ensure good and permanent electrical contact between the contact partners. If the contact legs are too narrow, under certain circumstances the normal contact force is not great enough to permanently ensure good electrical contact.

SUMMARY OF THE INVENTION

Therefore, the object of this invention is to make available the initially described plug-in contact which even at small dimensions enables a high normal contact force so that the plug-in connector even for contact holes with a small diameter ensures good and permanent electrical contact between the contact partners. Moreover, a method will be devised according to which a corresponding plug-in contact can be produced as simply as possible.

This object is achieved in the initially described plug-in contact in that a recess is made in the connecting region, bordering the two contact legs, and that the two contact legs, proceeding from the recess, have a distance from one another which increases in the direction of their free ends, the two contact legs having a spread state relative to one another. The two contact legs together have a width which is equal to or only slightly smaller than the diameter of the corresponding contact hole in the circuit board.

While in the known plug-in contact the width of the individual contact legs is only barely one-third of the diameter of the corresponding contact hole, in the plug-in contact as claimed in the invention the width of the individual contact legs can be more than 40% of the diameter of the contact hole in the circuit board into which the plug-in contact is to be plugged. In the plug-in contact as claimed in the invention this is achieved by the distance between the two contact legs being produced, not by punching out a corresponding material region, but by making a thin, blade-like parting cut between the two contact legs and subsequently spreading the two contact legs apart. The spacing of the contact legs to one another which increases in the direction of the free ends of the contact legs is thus produced by the contact legs being spread apart and not by a corresponding region being punched out between the contact legs.

The recess which is made in the connecting region and which is preferably circular provides first of all for the peak of the two contact legs, i.e., the point at which the contact legs are separated from one another, to be precisely established, independently of the production tolerances when the blade-like parting cut is being made between the contact legs. Moreover, the recess also provides for preventing undefined cracks or indents in the connecting region or the contact legs of the plug-in contact when the two contact legs are being spread apart.

According to one advantageous configuration of the plug-in contact as claimed in the invention, the two contact legs and the connecting region lie in one common plane so that the plug-in contact altogether, like the metallic flat material from which the plug-in contact is produced, is made flatter. The thickness of the plug-in contact over the entire extension of the plug-in contact corresponds essentially to the thickness of the flat material. Deviation from the uniform thickness can arise primarily by rounding of the edges, in particular on the outside contour of the contact legs.

According to another especially preferred configuration of the plug-in contact as claimed in the invention, the two contact legs have different lengths, i.e., there is a first longer contact leg and a second shorter contact leg. On the free end of the longer contact leg a guide section is made which is located in the plug-in direction of the plug-in contact upstream of the free end of the shorter contact leg. The guide section is used here as a feed and centering aid when the plug-in contact is being plugged into the corresponding contact hole in a circuit board. For this reason the guide section on its side facing away from the connecting region and thus facing the contact hole when plugging in preferably has a roughly semicircular outside contour. When the plug-in contact is being plugged into the contact hole, first the guide section of the first longer contact leg thus slides into the contact hole before the second shorter contact leg also dips into the contact hole, the two contact legs than being pressed onto one another by the contact wall of the contact hole so that the distance between the two contact legs decreases compared to the unplugged state.

Preferably, the dimensions of the plug-in contact are matched to the diameter of the contact hole such that the two contact legs even in the plugged-in state still have a short distance to one another, thus the two contact legs do not completely touch with their inside surfaces.

Another configuration of the invention calls for the two contact legs to have a wave shaped outside contour which extends in the longitudinal direction. Preferably the region of the crest of the wave shaped outside contour of the contact legs forms the contact-making region of the contact legs which makes contact with the contact hole in the plugged-in state. The wave shaped outside contour of the two contact legs facilitates the plugging of the plug-in contact into the contact hole in the circuit board. In the plugged state of the plug-in contact the two contact legs are then bent to the maximum onto one another so that the normal contact force is maximum between the contact legs and the inner wall of the contact hole. When the plug-in contact is being plugged into the contact hole the insertion force is however small enough that the plug-in contact by itself, or even located together with several plug-in contacts in a higher-pin plug, can still be easily mounted by hand.

According to another advantageous configuration of the plug-in contact as claimed in the invention, the two contact legs have an outside contour which is rounded in cross section at least in their contact region. The outside edges of the contact legs are thus machined at least in the region in which the contact legs in the plugged-in state make contact with the contact hole such that they are rounded. For this reason, the outside contour of the contact legs can have a radius which is smaller than the radius of the contact hole. This makes it possible to plug in and pull out the plug-in contact several times without major damage on the inside wall of the contact hole in the circuit board. Without the advantageously provided rounded outside contour, after a few plugging cycles grooves can appear in the wall of the contact hole by which the surface of the wall of the contact hole can be damaged.

The aforementioned object is achieved in the method for producing a plug-in contact with two flat contact legs which are resilient relative to one another, and one connecting region has the following steps:

punching a preform of the plug-in contact out of a metallic flat material as well as punching out or drilling a recess in the connecting region, making a blade-like parting cut between the two contact legs, the parting cut extending from the recess to the free ends of the contact legs and spreading the two contact legs apart.

In the method of the invention, the plug-in contact is produced by punching a preform of the plug-in contact out of a metallic flat material, the preform of the plug-in contact not yet corresponding to the finished shape of the plug-in contact. The preform of the plug-in contact differs in particular from the finished shape of the plug-in contact in that the two contact legs are not yet separated from one another. For this reason, according to the method in accordance with the invention, after punching out the preform of the plug-in contact a blade-like parting cut is made between the two contact legs which extends from the recess which has been made in the connecting region to the free ends of the contact legs. Afterwards the two contact legs are spread apart, the recess made in the connecting region ensuring that when the two contact legs are being spread apart cracks or notches do not arise in the transition region between the connecting region and the two contact legs.

According to one advantageous configuration of the method in accordance with the invention, the blade-like parting cut is made between the two contact legs by means of a punching tool, first one contact leg being deflected downward relative to the other contact leg, perpendicular to the longitudinal extension of the contact legs and perpendicular to the plane of the plug-in contact. In this way a parting cut between the two contact legs can be made without a region of the flat material between the two contact legs having to be removed, as is the case in the plug-in contact known from the prior art. Therefore, the separation of the two contact legs does not lead to a reduction of the width of the contact legs, as a result of which a plug-in contact can be produced which can also then apply a relatively high normal contact force if it is made for a contact hole with a small diameter.

According to another preferred configuration of the method, it is provided that the outside contour of the contact-making regions of the two contact legs which make contact with the contact hole in the plugged-in state is rounded by embossing or grinding. This rounding of the outside contour of the contact legs can proceed both after the first method step, i.e., after punching out the preform of the plug-in contact, and also after the second method step, making the blade-like parting cut. Moreover, it is also possible to round the outside contour of the contact regions of the two contact legs as the last method step, then its having to be watched that the two contact legs are not bent back out of their intentional spread position.

In particular, at this point, there are a host of possibilities for configuring and developing the plug-in contact in accordance with the invention as well as the method in accordance with the invention as will become apparent from the following description of preferred exemplary embodiments in conjunction with the drawings.

DETAILED DESCRIPTION OF THE INVENTION

Figures 1, 2:
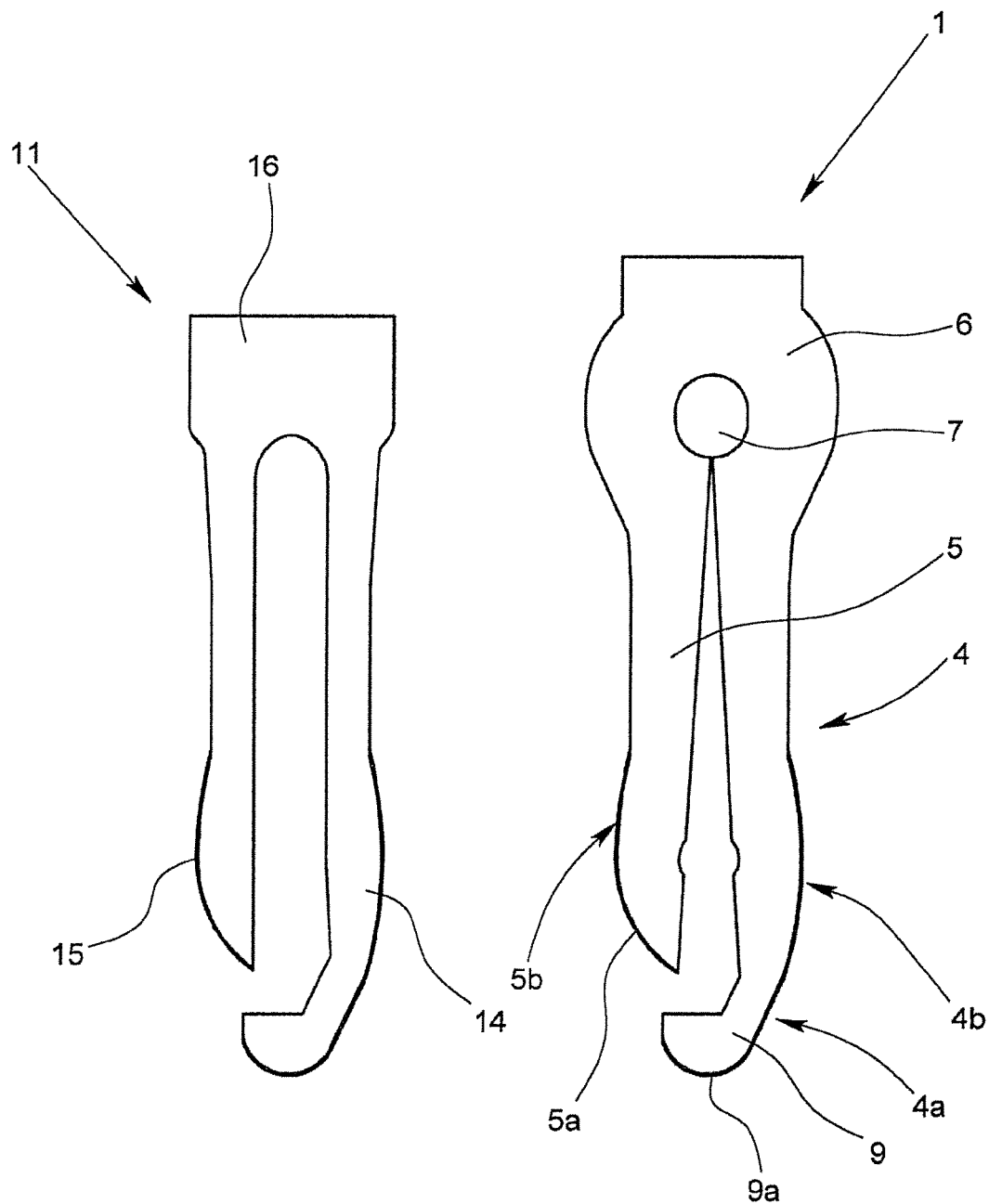
FIG. 1 shows a representation of a plug-in contact known from the prior art, in a plan view.
FIG. 2 shows a corresponding representation of a plug-in contact in accordance with the invention.

FIG. 1 shows a plug-in contact 11 according to the prior art which is punched out of a flat metal material. In comparison, FIG. 2 shows a plug-in contact 1 in accordance with the invention, the plug-in contact 1 in accordance with the invention also having been punched out of a flat metal material. Both plug-in contacts 1, 11 are used to make contact with the printed conductor of a circuit board 2 which is shown in FIG. 3 by way of a cutaway portion. A plug-in contact 1 is plugged into a corresponding contact hole 3 in the circuit board 2 for this purpose.

The known plug-in contact 11 which is shown in FIG. 1 has two contact legs 14, 15 which are connected to one another via a common connecting region 16, the contact legs 14, 15 extending out of the connecting region 16 in the plug-in direction E of the plug-in contact 11. In the known plug-in contact 11, the two contact legs 14, 15 are produced by the region between the contact legs 14, 15 being punched out when the plug-in contact 11 is being punched out. As FIG. 1 shows, the width of the region which has been punched out between the two contact legs 14, 15 is somewhat greater than the width of the two contact legs 14, 15. The width of the individual contact legs 14, 15 thus corresponds respectively to only barely ⅓ of the total width of the plug-in contact 1 in the plugged-in state, and thus, also to only barely ⅓ of the diameter D of the contact hole 3 in the circuit board 2 into which the plug-in contact 11 is to be plugged. For small hole diameters, this leads to the contact legs 14, 15 of the plug-in contact 11 being made very narrow and also very thin; this leads to the normal contact force which is being applied by the contact legs 14, 15 being only relatively small.

The plug-in contact 1 in accordance with the invention which is shown in FIGS. 2 to 6 likewise has two contact legs 4, 5 which are connected to one another via a common connecting region 6, the contact legs 4, 5 extending out of the connecting region 6 in the plug-in direction E of the plug-in contact 1. Moreover, the plug-in contact 1 in the connecting region 6, bordering the two contact legs 4, 5, has a recess 7 which is made roughly circular. The two contact legs 4, 5, proceeding from the recess 7, have a distance from one another which increases in the direction of their free ends 4a, 5a, the two contact legs 4, 5 having a spread state relative to one another.

The two contact legs 4, 5 in their contact-making region 4b, 5b with which they make contact with the contact hole 3 in the plugged-in state together have a width B which is only somewhat smaller than the diameter D of the corresponding contact hole 3 (compare FIG. 3). This is enabled in the plug-in contact 1 in accordance with the invention by the intermediate space between the two contact legs 4, 5 being produced, not by punching out, but by spreading apart the two contact legs 4, 5 which have been separated from one another beforehand by a blade-like parting cut 8. FIG. 3 also shows that the width 131 of the first contact leg 4 and the width B2 of the second contact leg 5 in the contact-making region 4b, 5b is each more than 40% of the diameter D of the contact hole 3. Since the normal contact force with which the contact legs 4, 5 press against the inside wall of the contact hole 3 is proportional to the square of the width of the contact legs 4, 5, the greater width of the two contact legs 4, 5 which is implemented in the plug-in contact 1 in accordance with the invention leads to a distinct increase of the possible normal contact force.

As the figures show, the two contact legs 4, 5 have different lengths, on the free end 4a of the longer first contact leg 4 there being a guide section 9 which in the plug-in direction E of the plug-in contact 1 is located upstream of the free end 5a of the shorter contact leg 5. The guide section 9 is used as a feed and centering aid when the plug-in contact 1 is being plugged into the corresponding contact hole 3 of a circuit board 2, as is apparent in particular from FIG. 3. The guide section 9 on its side 9a facing away from the connecting region 6 and facing the contact hole 3 when plugging in has a roughly semicircular outside contour which when the plug-in contact 1 is being plugged into the contact hole 3 dips first into the contact hole 3.

Figure 3A:
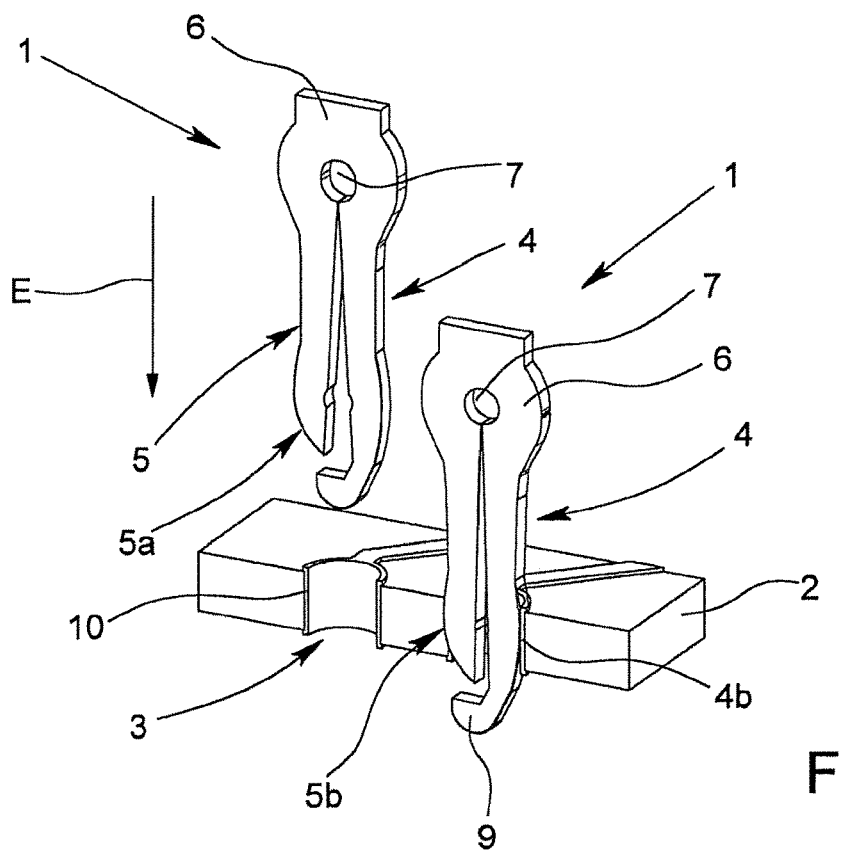
FIG. 3a is a perspective side view of a cutaway portion of a circuit board with two contact holes and two plug-in contacts, one plug-in contact being plugged into a contact hole.
Figure 3B:
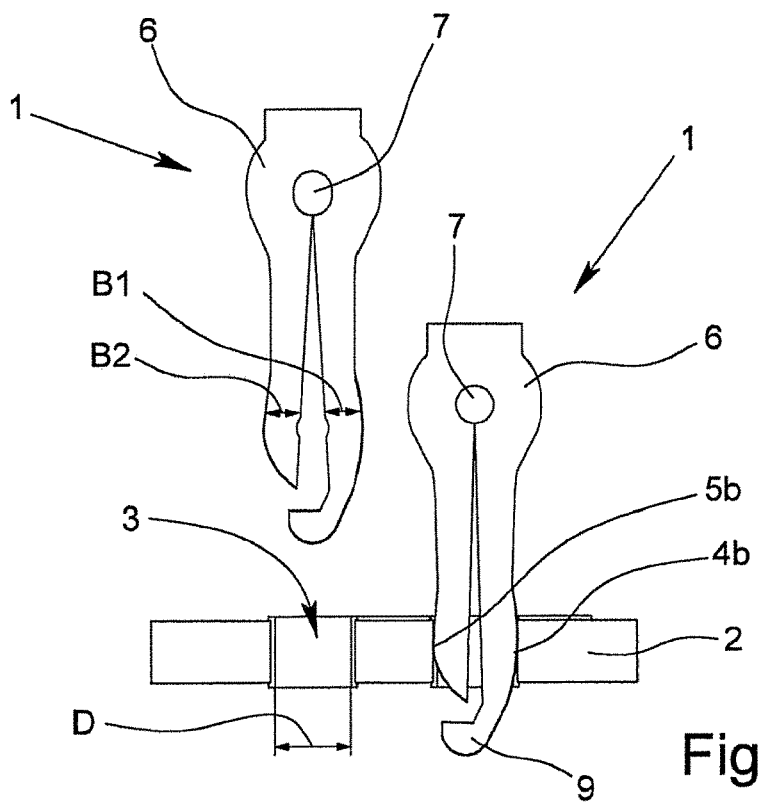
FIG. 3b is a side view thereof.

It is moreover apparent from FIGS. 3a & 3b that the contact legs 4, 5 have a wave shaped outside contour which extends in the longitudinal direction, the contact-making region 4b, 5b of the contact legs 4, 5 being located in the region of the crest of the wave shaped outside contour.

Figure 4:
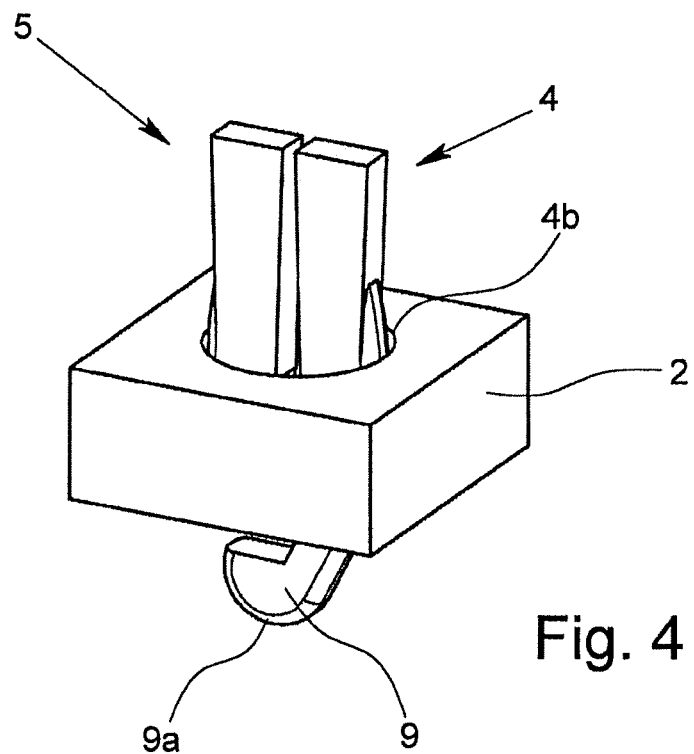
FIG. 4 is a perspective side of a portion of a plug-in contact plugged into a contact hole.
Figure 5:
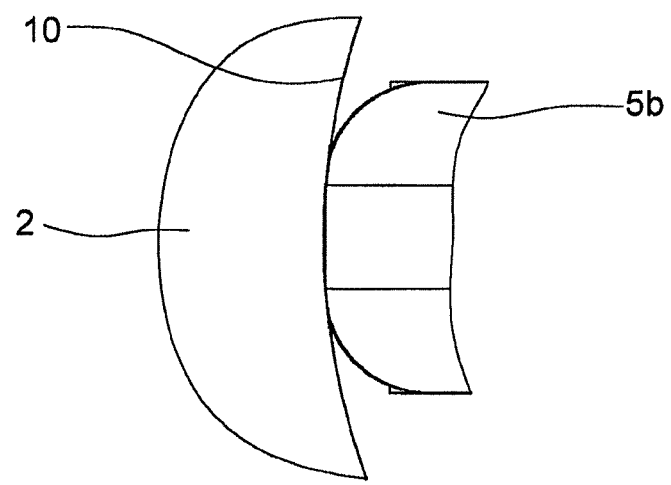
FIG. 5 shows an enlarged detail of a contact leg which is plugged into a contact hole, in cross section.

FIG. 4 shows a cutaway portion of a plug-in contact 1 which has been plugged into a contact hole 3 of a circuit board 2 and in which the contact legs 4, 5 at least in the contact-making region 4b, 5b have an outside contour which is rounded in cross section, as is apparent in particular from the detailed enlargement according to FIG. 5. As can be recognized in this cross section of one cutaway portion of the contact hole 3 and of one contact leg 5 adjoining the inside wall 10 of the contact hole 3, the outside contour of the contact leg 5 is machined such that the outside contour in the contact region 5b has no edges, but is rounded and provided with a radius. This makes it possible to plug in and pull out the plug-in contact 1 more often without major damage to the inside wall 10 of the contact hole 3 in the circuit board 2. Thus damage to the layer which forms the inside wall 10 and which is intended for accomplishing a good electrical connection within the contact hole 3 is prevented.

The individual production steps of the plug-in contact 1 in accordance with the invention and the method for producing the plug-in contact 1 in accordance with the invention will be briefly described below using FIG. 6 in which the plug-in contact 1 and corresponding preforms of the plug-in contact 1 are shown in five successive production steps.

Figure 6:
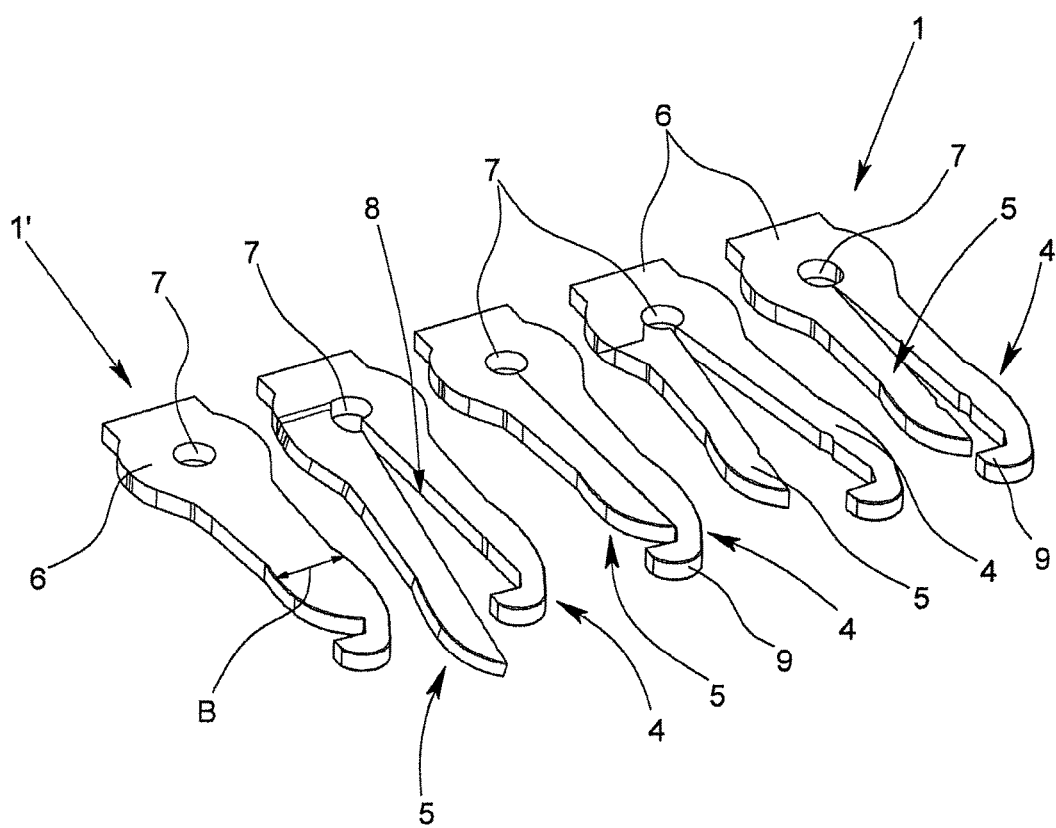
FIG. 6 shows the plug-in contact in five successive production steps.

FIG. 6, extreme left, shows as the first production stage a preform 1' of the plug-in contact 1 which had been produced by corresponding punching out of a metallic flat material. Here a recess 7 which can be punched out with the punching out of the preform 1' or can be punched out or drilled separately is already made in the connecting region 6 of the plug-in contact 1 or of the preform 1'.

In the second production stage the two contact legs 4, 5 are separated from one another by a blade-like parting cut 8 having been made between the two contact legs 4, 5 by means of a punching tool. This leads to the contact leg 5 being deflected downward relative to the other contact leg 4, perpendicular to the longitudinal extension of the contact leg 5 and perpendicular to the plane of the plug-in contact 1, as is shown in the second figure from the left in FIG. 6. Here it is also apparent that the parting cut 8 extends from the recess 7 as far as the free ends 4a, 5a of the contact legs 4, 5. In the following step the contact leg 5 which has been deflected downward beforehand is again bent back into the plane of the plug-in contact 1 and thus also into the plane of the other contact leg 4 (middle figure in FIG. 6).

In the last two method steps then the two contact legs 4, 5 are spread apart, in a first step the contact legs 4, 5 being spread apart beforehand first of all beyond their end position. In the last production step shown in FIG. 6 at extreme right the contact legs 4, 5 in comparison are bent again somewhat onto one another so that the width of the plug-in contact 1 in the contact-making region 4b, 5b of the two contact legs 4, 5 is only somewhat greater than the diameter D of the contact hole 3. Via the adjustment of the distance between the two contact legs 4, 5 both the insertion force necessary for plugging the plug-in contact 1 into the contact hole 3 and also the normal contact force which is acting in the plugged-in state between the contact legs 4, 5 and the contact hole 3 can be adjusted.

Because the two contact legs 4, 5 are first spread apart somewhat farther than in the final state and then are pressed again onto one another to the final amount, the compressive stress which is acting first in the outside region of the contact legs 4, 5 is converted into tensile stress; this benefits the spring action of the plug-in contact 1. Moreover, then the last bending step in the production of the plug-in contact 1 takes place in the same direction as the loading of the plug-in contact 1 in the mounted state since the two contact legs 4, 5 in the state plugged into the hole 3 are being pressed onto one another. This is also advantageous to achieve a long-lasting high contact force.

What is claimed is:

1. A plug-in contact for making electrical contact with a circuit board by means of plugging the plug-in contact into a contact hole of the circuit board, with two flat contact legs which are resilient relative to one another, and one connecting region, from which the two contact legs extend in the plug-in direction (E) of the plug-in contact, the plug-in contact being punched in one piece out of a metallic flat material,
    characterized in
    that a closed recess is located within the connecting region, bordering the two contact legs,
    that the two contact legs, proceeding from the recess, have a distance from one another which increases in the direction toward their free ends, the two contact legs having a spread state relative to one another,
    that the two contact legs together have a width which is equal to or only slightly smaller than the diameter of the corresponding contact hole in the circuit board, and
    that the point at which the contact legs begin to separate from one another commences at the recess and is established by the recess independently of the production tolerances.

2. The plug-in contact as claimed in claim 1, wherein the two contact legs and the connecting region lie in a common plane.

3. The plug-in contact as claimed in claim 1, wherein the two contact legs have different lengths, on the free end of the longer contact leg a guide section being made which is located in the plug-in direction of the plug-in contact upstream of the free end of the shorter contact leg.

4. The plug-in contact as claimed in claim 1, wherein the two contact legs have a wave-shaped outside contour which extends in the longitudinal direction.

5. The plug-in contact as claimed in claim 4, wherein the contact-making region of the contact legs which makes contact with the contact hole in the plugged-in state is located in the region of the crest of the wave-shaped outside contour of the contact legs.

6. The plug-in contact as claimed in claim 1, wherein the two contact legs have an outside contour which is rounded in cross section at least in their contact-making region which makes contact with the contact hole in the plugged-in state.

7. The plug-in contact as claimed in claim 1, wherein the recess is circular and adjoins the separation between the contact legs.

8. A method for producing a plug-in contact with two flat contact legs which are resilient relative to one another, and are connected via a connecting region, comprising the following steps:
    punching a preform of the plug-in contact out of a metallic flat material as well as punching out or drilling a closed recess within the connecting region,
    making a blade-shaped parting cut between the two contact legs, the parting cut extending from the recess to free ends of the contact legs, and
    spreading the two contact legs apart so that the contact legs, commencing from the recess, have a distance from one another which increases in a direction toward the free ends.

9. The method as claimed in claim 8, wherein the contact legs are spread apart to beyond an intended final position and then the contact legs are bent towards one another to their final position.

10. The method as claimed in claim 8, wherein when the blade-shaped parting cut is made, first one contact leg is deflected relative to the other contact leg perpendicular to a longitudinal extension of the contact legs and perpendicular to a plane of the plug-in contact, and in a following step, the deflected contact leg is bent back again into the plane of the plug-in contact.

11. The method as claimed in claim 8, wherein an outside contour of the contact-making regions of the two contact legs which make contact with the contact hole in the plugged-in state is rounded by embossing or grinding.

* * * * *